United States Patent [19]

Josephs et al.

[11] Patent Number: 4,501,975
[45] Date of Patent: Feb. 26, 1985

[54] JOSEPHSON JUNCTION LATCH CIRCUIT

[75] Inventors: Richard M. Josephs, Willow Grove; Tsing-Chow Wang, Norristown, both of Pa.

[73] Assignee: Sperry Corporation, New York, N.Y.

[21] Appl. No.: 349,414

[22] Filed: Feb. 16, 1982

[51] Int. Cl.³ .................... H03K 3/00; H03K 3/38
[52] U.S. Cl. .................... 307/277; 307/306; 307/462; 357/5
[58] Field of Search .............. 307/462, 277, 306; 357/5

[56] References Cited

U.S. PATENT DOCUMENTS 3,879,715  4/1975  Zappe ........................... 307/306
4,413,196 11/1983  Josephs et al. ................ 307/306
4,413,197 11/1983  Josephs et al. ................ 307/306

OTHER PUBLICATIONS

Herrell, "Josephson Multivibrator and Monostable Circuits," IBM Technical Disclosure Bulletin, vol. 17, No. 10, Mar. 1975, pp. 3082-3083.
Jutzi, "An Inductively Coupled Memory Cell for NDRO With Two Josephson Junctions," Cryogenics, Feb. 1976, pp. 81-88.
Beresford, "Josephson Chip has 177-Device Circuit," Electronics, vol. 55, No. 3, Feb. 1982, pp. 38-39.
Wang et al., "High Gain, Wide Margin Josephson Junction OR and AND Gates," Inter. Electron Device Meeting, Dec. 1981, Washington, D.C., pp. 118-121.

Primary Examiner—John S. Heyman
Assistant Examiner—Timothy P. Callahan
Attorney, Agent, or Firm—John B. Sowell; Thomas J. Scott; Marshall M. Truex

[57] ABSTRACT

A Josephson junction latch circuit is provided which has an AND gate having plural inputs and a single output. The output of the single AND gate is directly coupled to a Josephson junction flux storage loop capable of storing flux indicative of the output of the AND gate. A Josephson junction sense line is provided capable of sensing the flux condition of the flux storage loop. The sense line is directly coupled to amplifying gates which produce amplified true and complement quantities whenever the sense line is actuated.

5 Claims, 6 Drawing Figures

JOSEPHSON JUNCTION LATCH CIRCUIT

BACKGROUND OF THE INVENTION

1. Field of the Invention

This invention relates to an improved superconductive Josephson junction logic circuit. More particularly, this invention relates to a new and improved Josephson junction logic latch circuit.

2. Related Applications

This invention is in part related to our co-pending application entitled "Three Josephson Junction Direct-Coupled Isolation Circuit", Ser. No. 288,148 filed Aug. 31, 1981, now U.S. Pat. No. 4,413,196 which shows and describes a novel OR logic circuit which provides an amplified output. Further, this invention relates in part to our co-pending application entitled "A Four Josephson Junction Direct-Coupled AND Gate Circuit", Ser. No. 298,149 filed Aug. 31, 1981, now U.S. Pat. No. 4,413,197 which shows and describes an AND logic circuit which also provides amplification.

3. Description of the Prior Art

Prior art logic circuits which employ Josephson junction devices are presently classified in U.S. Class 307, sub class 306 with superconductive devices. The prior art includes A. Davidson's article entitled "A Josephson Latch", IEEE Journal of Solid State Circuits Volume SC-13 No. 5, October, 1978 at pages 583 to 590. This 1978 IEEE article shows a Josephson junction latch which includes ten interferometers and each interferometer comprises a plurality of Josephson junctions. A block diagram logic circuit shows the equivalent of a flip-flop which requires a separate d.c. power source to store one bit. Further, the block diagram logic circuit requires a self-gating AND gate (SGA). The input signals to the SGA are described as being provided by a flip-flop. The signals from the flip-flop are not in usable form as true or complement output signal levels.

The prior art also includes H. C. Jones' and T. R. Gheewalas' article entitles "Ultra High Speed Josephson Latch", IEEE International Conference on Circuits and Computers, Volume 2, 1980 at pages 884 to 886. A two-port data latch circuit is shown as FIG. 2 on pages 885. This latch circuit is a modification of the afore-mentioned Davidson article in that the flip-flop or storage loop does not require a separate d.c. power supply. The schematic circuit shows a slave circuit in the place of the SGA circuit of the afore-mentioned article. This latch circuit employs a modified input AND-OR gate system to provide input isolation to the input AND gate.

Both of the above prior art circuits employ interferometers in the input and output which are inductively coupled devices.

It would be desirable to provide a simplified Josephson junction logic circuit which can be employed as a logic module building block and which provides two direct-coupled amplified outputs representative of a true quantity and a complement of the true quantity.

SUMMARY OF THE INVENTION

It is a principal object of the present invention to provide a new Josephson junction logic latch module building block.

It is another principal object of the present invention to provide a novel Josephson junction latch circuit having a direct-coupled input and output which also provides electrical isolation.

It is yet another principal object of the present invention to provide a novel Josephson junction latch circuit which has a sample and hold capability.

It is another object of the present invention to provide a Josephson junction logic latch circuit having fewer elements and faster operation.

It is yet another object of the present invention to provide a novel Josephson junction logic circuit having an improved speed of operation.

According to these and other objects of the present invention, there is provided a new and improved Josephson junction latch logic circuit comprising an AND gate for receiving a data signal and an enable signal and for producing an output signal connected to a Josephson junction flip-flop flux storage loop. The flux storage loop is inductively coupled to a novel sensing circuit which comprises a pair of amplifying gates. The amplifying gate circuit provides an amplified true quantity and an amplified complement quality indicative of the state of the flux storage loop when it was sensed.

DESCRIPTION OF THE PREFERRED EMBODIMENT

Figure 1:
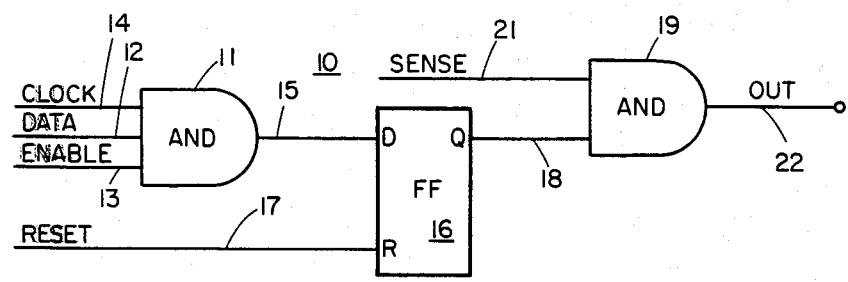
FIG. 1 is a block diagram employing conventional logic blocks to illustrate the operation of the present invention latch circuit.

Latch circuit 10 comprises the Josephson junction AND gate 11 shown having two inputs plus a clock input. If the high data signal on line 12 and the high enable signal on line 13 are present when the high clock signal arrives on line 14, a high output signal is produced on line 15. Line 15 is directly connected to the data input of flip-flop 16. Flip-flop 16 is also provided with a reset line 17 which is employed to clear the flux storage loop flip-flop 16 prior to initiation of operation or prior to storage of a new bit therein. Flip-flop 16 is provided with a Q output line 18 which provides the true quantity of the data bit being stored. Output line 18 is shown connected to AND gate 19. When a sense signal is provided on sense line 21 to AND gate 19, the logic state present on output line 18 is produced at the output line 22. As long as the flux storage loop 16 is maintained in its high flux storage state, the output on output line 22 will not change in the presence of a sense signal on line 21. However, if a new bit is to be stored in the flip-flop 16, flip-flop 16 must be reset by a signal on line 17 in order to change the state of flip-flop 16 corresponding to the data bit being provided on line 15.

Figure 2:
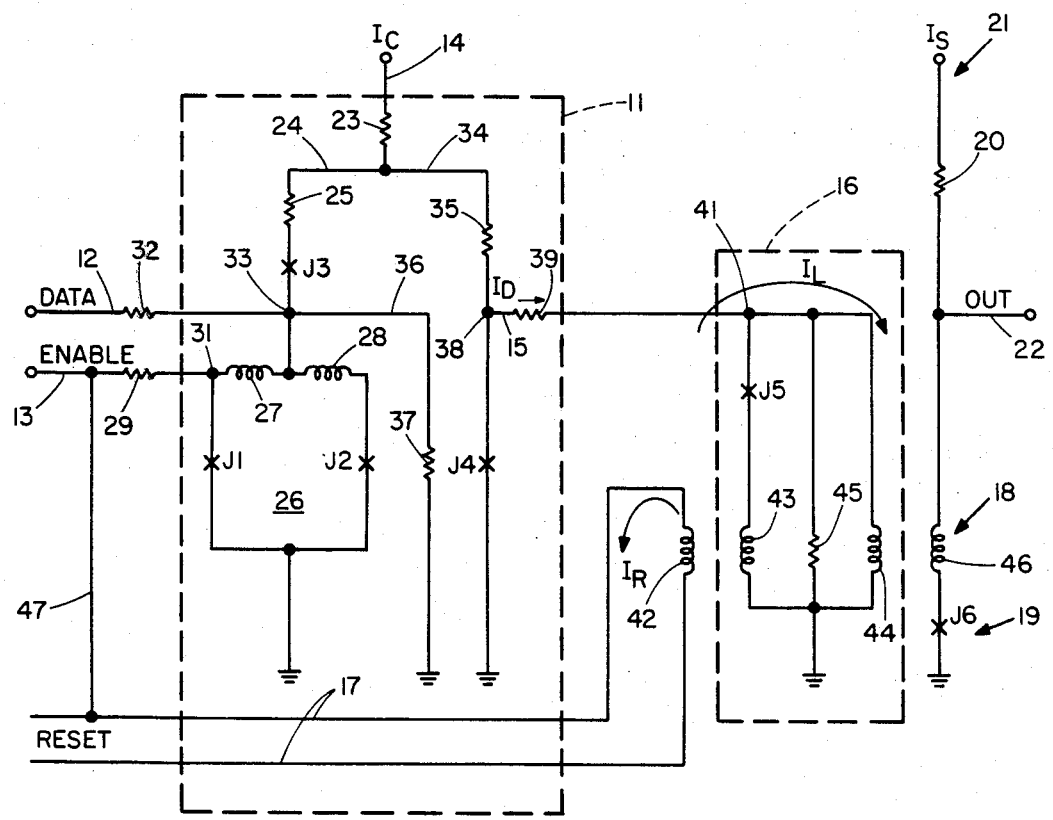
FIG. 2 is a schematic circuit diagram of the present invention latch.

Refer now to FIG. 2 showing a schematic circuit diagram embodying the principals set forth in FIG. 1.

The input AND gate 11 is shown in phantom lines at block 11. The Josephson junction flip-flop flux storage loop 16 is shown in phantom lines at block 16. The output AND gate 19 comprises Josephson junction J6 which is connected in series with the inductive coupling 46 (Q output line 18 in FIG. 1) and the sense line 21 to provide an output on output line 22. Sense line 21 is provided with a resistor 20.

Clock line 14 is shown having a current source $I_C$ which passes through clock line source resistor 23. Part of the current is transmitted through the input branch 24 and input branch resistor 25. The current in input branch 24 is transmitted through Josephson junction J3 to interferometer 26 where the current again splits. The two branches of the interferometer are through inductive reactance 27 and Josephson junction J1 to ground or through the inductive reactance 28 and Josephson junction J2 to ground. The current supply to Josephson junctions J1, J2 and J3 from the clock current source $I_C$ is insufficient to switch any of these Josephson junctions in the input branch. When a high enable signal is present on line 13, a signal is passed through input resistor 29 to node 31 of the interferometer 26. This additional current is insufficient to switch Josephson junctions J1 and J2. However, when a high data signal is also present on data line 12, it passes through input resistor 32 to node 33. This additional current is passed to interferometer 26 and with the enable current from enable line 13 becomes sufficient to first switch Josephson junction J1 to its high voltage or high impedance state which steers the current present at node 33 into the second branch of the interferometer 26 and causes Josephson junction J2 to switch to its high impedance state. Since Josephson junctions J1 and J2 are both switched to their high impedance state, the clock current available in clock line 14 is now redistributed into the output branch 34 and passes through the output branch resistor 35 and Josephson junction J4 to ground. This current is sufficient to switch Josephson junction J4 to its high impedance state which redistributes the current at clock line 14 to the input branch 24. This causes the Josephson junction J3 to switch. After the four Josephson junctions of AND gate 11 are all switched to their high impedance state, the majority of the current at data line 12 and enable line 13 passes through node 33, sink line 36 and through sink resistor 37 to ground. Most of the clock current on clock line 14 passes through clock line source resistor 23 and the output branch 34 to node 38 where it is available as a data current $I_D$ on output line 15. The current in data line 15 passes through data line resistor 39 and appears as a high logic signal to the Josephson junction flip-flop flux storage loop 16.

Assume that the Josephson junction storage loop 16 has been reset by a reset signal on line 17 causing a reset current $I_R$ to flow in reset inductive loop 42. Reset inductive loop 42 is inductively coupled to reset loop 43 which causes a current to flow in the Josephson junction flip-flop flux storage loop 16 sufficient to reset the loop to its low flux state. When the high logic level signal is presented at node 41 and the storage loop 16 is reset, the current is sufficient to switch Josephson junction J5 from its low impedance state to its high impedance state. When Josephson junction J5 switches to its high impedance state, the data current $I_D$ will be diverted through the storage inductance 44 to ground. At the same time, the current flowing through Josephson junction J5 is decreasing and continues to decrease until it resets itself and switches back to its low impedance state. At this time all of the data current $I_D$ is flowing through storage inductor 44 to ground producing a net flux through storage loop 16. Even though $I_D$ is subsequently reduced to zero at node 38, the conservation of flux property of a superconducting loop assures that a circulating current $I_L$ flowing clockwise through the storage loop 16 will be set up to conserve the initial flux state. The damping resistor 45 in storage loop 16 is provided to assure that the Josephson junction J5 will have the proper environmental conditions to automatically reset itself to its low impedance state after having been set in its high impedance state. The damping resistor 45 also provides a leakage path to ground so that the loop current $I_L$ can be damped to zero. This allows the storage loop 16 to return to the low flux state when the reset current $I_R$ is applied to reset line 17.

Assuming that the storage loop 16 is in its high logic flux state and the data current $I_D$ on line 15 is no longer required to maintain flux in storage inductance 44. The lines of flux in inductance 44 couple with the inductive loop 46 in line 18. The induced current in line 18 is not sufficient to switch Josephson junction J6. When the sense current $I_S$ is applied to sense line 21, it increases the current in Josephson junction J6 sufficiently to switch Josephson junction J6 which operates as an AND gate 19 to produce a high logic level output signal on line 22. It should be noted that flux storage loop 16 serves as a non volatile storage flip-flop which must be reset by an external signal such as that shown on lines 17. The data bit stored in storage loop 16 can be sensed an infinite number of times without destroying the data stored therein. If the storage loop 16 is in its low flux state representative of a low logic level, there is no flux coupling the inductive loops 44 and 46 and no current is produced by flux coupling in line 18, thus, the sense current $I_S$ is insufficient to switch the Josephson junction J6 and the logic level presented on the output line 22 would be representative of a low level logic signal.

It will now be recognized that the schematic circuit diagram of FIG. 2 is not an exact representation of the block diagram of FIG. 1 because the mode of operation of Josephson junction devices differs slightly from typical AND gate and flip-flop logic operation.

A recirculation line 47 is shown connecting the reset signal line 17 to the enable signal line 13. This line 47 is optional and may be used when the enable signal is always going to be applied shortly after the reset signal.

Figure 3:
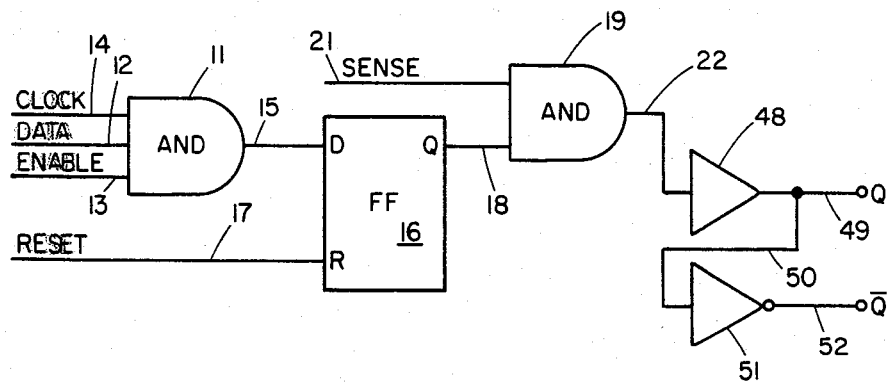
FIG. 3 is a block diagram employing conventional logic blocks to illustrate a modification of the latch shown in FIGS. 1 and 2 to further provide a sample and hold circuit.

Refer now to FIG. 3 which is a block diagram employing conventional logic to illustrate the mode of operation of a modified latch circuit of the type shown in FIGS. 1 and 2. AND gate 11 is provided with the same three inputs 12, 13 and 14 as described hereinbefore with regards to FIGS. 1 and 2. The signal output on line 15 and the reset signal on line 17 connected to the flip-flop 16 are the same as described hereinbefore. The true quantity Q output on line 18 and the sense signal on sense line 21 are applied to the same AND gate 19 to produce an output on line 22 which is capable of driving Josephson junction logic circuits. It may be desired that the Q output be amplified or amplified and inverted, accordingly, the output on line 22 may be applied to an OR gate amplifier 48 to provide an amplified fan out signal on line 49, shown as an amplified Q signal. The signal on lines 49 and 50 may be inverted in OR gate amplifying inverter 51 to produce the complement of the amplified Q signal shown as a $\overline{Q}$ signal on line 52.

Figure 4:
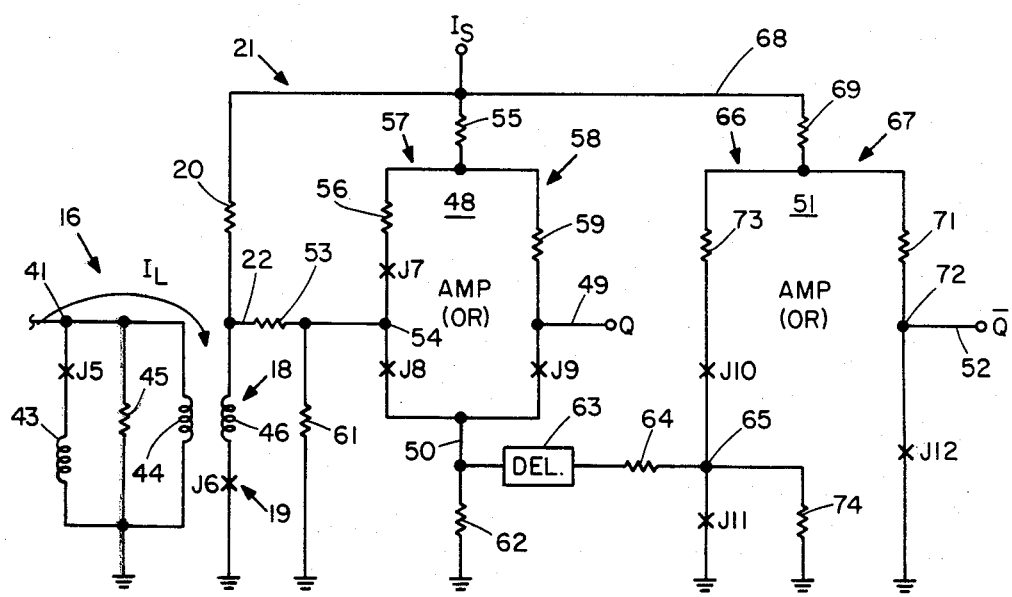
FIG. 4 is a schematic circuit diagram of the modified latch of FIG. 3.

Refer now to FIG. 4 which shows the schematic circuit diagram of the FIG. 3 embodiment. The flux storage loop 16 comprises an input node 41, a reset loop inductance 43, a storage loop inductance 44 and a damping resistor 45 in combination with a Josephson junction J5. As explained hereinbefore, a high logic signal or a low logic signal appearing at node 41 is capable of setting the flux storage loop 16 in a high flux state or a low flux state. Once the storage loop 16 is set in its high flux storage state, it continues to maintain its circulating flux as shown by the arrow indicative of the loop current $I_L$. This persistant loop current $I_L$ may be sensed by a high level signal applied to the sense line 21 as explained hereinbefore. A high level signal on sense line 21 in combination with a flux field current applied to inductance loop 46 is sufficient to switch Josephson junction J6 and produce a high level logic output at output line 22. Assume that a high logic level signal is sensed and a signal is present on output line 22. The signal on line 22 passes through isolation output resistor 53 and appears as a high logic signal at input node 54 to amplifier 48. When the sense current $I_S$ is high, a current is flowing through source resistor 55 and input branch resistor 56 of the input branch 57. The current passes through Josephson junction J7 and Josephson junction J8. The current at Josephson junction J8 is increased by the current from output line 22 causing Josephson junction J8 to switch initially to a high impedance state. This switching of Josephson junction J8 causes a redistribution of the current in source resistor 55 to flow in the output branch 58 through the output branch resistor 59 and through Josephson junction J9 causing it to switch to its high impedance state. The switching of Josephson junction J9 causes another redistribution of current which increases the current in the input branch 57, thus, causing Josephson junction J7 to switch to its high impedance state. When all three Josephson junctions J7, J8 and J9 are switched to their high impedance state, the current being supplied by output line 22 is diverted through sink resistor 61 to ground. Further, the sense current flowing through source resistor 55 is substantially diverted into the output branch 58 and through the output branch resistor to the Q (true quantity) output line 49 as an amplified Q output signal.

When the amplifier 48 is switched ON and its three Josephson junctions are in their high impedance state, and the true quantity Q output is high, very little current is flowing in the line 50. The current in line 50 is divided through the sink resistor 62 and the input resistor 64 via delay 63 to provide a low logic signal at node 65. Node 65 is the input node to amplifier 51 which comprises an input branch 66 and an output branch 67. The sense current on line 68 which passes through source resistor 69 is insufficient to cause switching of any of the Josephson junctions of amplifier 51 when node 65 is in the low logic state. Thus, the sense current on line 68 flows through the source resistor 69, the input branch resistor 73, and the output branch resistor 71 to the output node 72 to provide an amplified output signal $\overline{Q}$ (complement of the true quantity output Q) on output line 52. In this case, $\overline{Q}$ is at its low logic level.

When amplifier 51 is in its low logic or OFF condition, the Josephson junctions J10, J11 and J12 are all in their low impedance superconducting state so that node 72 is at the ground condition. As long as the sense current $I_S$ is held high, the output condition of Q and $\overline{Q}$ on lines 49 and 52 will remain unchanged. However, when the sense current $I_S$ is dropped to a low level condition, the amplifiers 48 and 51 and the Josephson junction J6 are all reset to their zero voltage states.

Assume now that the flux storage loop 16 has a low logic level condition and when sensed by the sense current $I_S$ produces a low logic level condition on output line 22 which produces a low logic level signal at input node 54. As long as the low logic level signal is present at input node 54, the sense current in the input branch 57 is insufficient to switch any of the Josephson junctions of amplifier 48. As long as the Josephson junctions J7, J8 and J9 are in their low impedance state, there is a high logic current condition present on line 50. When the high logic level signal on line 50 is applied through delay 63 and input resistor 64, a high logic level signal is produced at input node 65 of amplifier 51. The delay 63 is needed to avoid false triggering of amplifier 51 before amplifier 48 switches. This high logic level signal at node 65 in combination with the sense current $I_S$ being diverted through the input branch 66, input branch resistor 73 and Josephson junction J10 is sufficient to produce a switching current to initiate switching of Josephson junction J11. After Josephson junction J11 switches, current is diverted from the input branch 66 into the output branch 67 sufficient to cause switching of Josephson junction J12. When Josephson junction J12 switches, current is again diverted from the output branch 67 into the input branch 66 which is sufficient to cause switching of Josephson junction J10. When all three Josephson junctions J10, J11 and J12 are switched to their high impedance state, amplifier 51 is in the ON condition and the majority of the sense current in line 68 is being diverted into the output branch 67 and appears at output node 72 causing the $\overline{Q}$ condition to be high on output line 52. When the amplifier 51 is in its ON condition, the input current passing through input resistor 64 to node 65 will be diverted through sink resistor 74 to ground. When the sense current $I_S$ is again removed, amplifiers 48, 51 and Josephson junction J6 will return to their reset or zero voltage condition.

It is appropriate at this time to explain that Josephson junction devices are current steering devices and that reference to a high logic level and a low logic level are not references to voltage levels as is usually applicable to semiconductor devices. The low level condition of a Josephson junction node is representative of a no current or substantially a no current condition. The high level logic condition is representative of a high level current flow condition.

Figure 5:
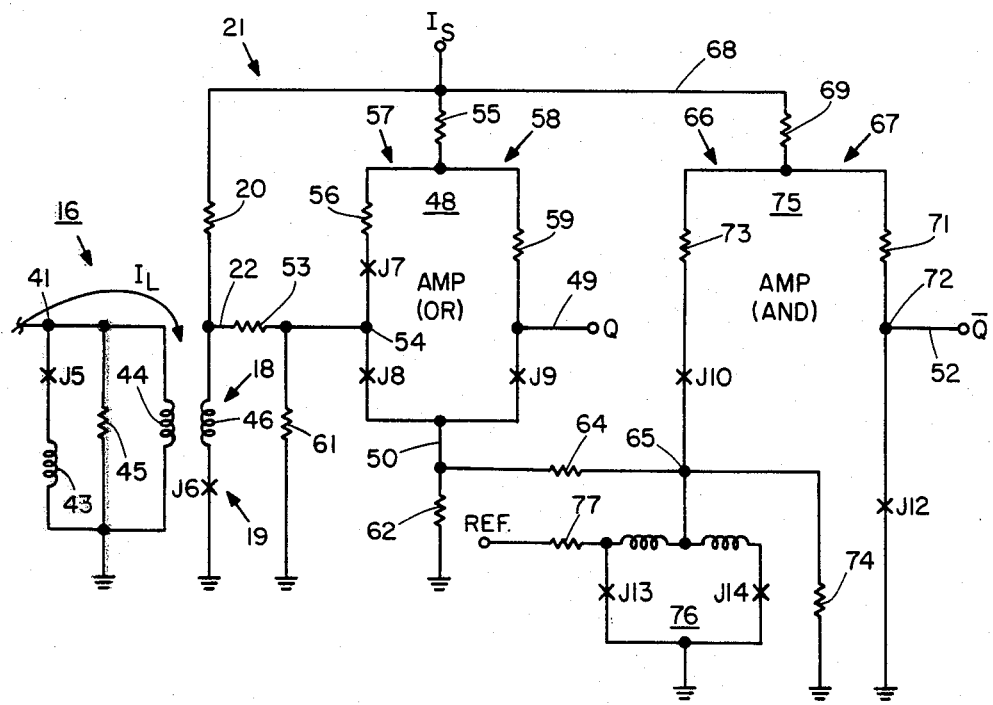
FIG. 5 is a schematic circuit diagram of another modification of the latch of FIG. 4.

Refer now to FIG. 5 showing a modified schematic circuit diagram of the FIG. 4 latch. The flux storage loop 16 and the OR gate circuit amplifier 48 which produces the Q or true quantity output on line 49 are the same as those described hereinbefore with regard to FIG. 4. These circuit elements and other portions of the circuit have been numbered identically to those in FIG. 4 and operate in the identical manner. Thus, this portion of the circuit does not require explanation again.

When the Q output of amplifier 48 is low, a high level logic signal is present on line 50. It produces a high level logic signal and an input current at the input node 65 to the AND gate amplifier 75. The sense current on line 68 produces an additional sense current at node 65. These two currents in combination are insufficient to initiate switching of either Josephson junction J13 or J14 of interferometer 76. However, when a reference current is applied through reference resistor 77, additional current flows through Josephson junction J13 sufficient to initiate switching of Josephson junction J13. After Josephson junction J13 switches, it causes Josephson junction J14 to switch to its high impedance state, thus, blocking the current flowing through node 65 to ground and diverts the current into the second branch 67, which causes Josephson junction J12 to switch to its high impedance state. When Josephson junction J12 switches to its high impedance state, the current flowing in source resistor 69 is again diverted back to the input branch 66 and there is sufficient current flowing through Josephson junction J10 to switch junction J10 to its high impedance state. After all four Josephson junctions of amplifier 75 have switched to their high impedance state, there is an amplified current produced at output node 72 to provide a high $\overline{Q}$ output on output line 52.

As explained hereinbefore when the sense current $I_S$ is substained, the amplifiers 48 and 75 continue to produce proper output signals on output lines 49 and 52. However, when the sense current $I_S$ is removed, amplifier 48, amplifier 75 and Josephson junction J6 are returned to their zero voltage states. When the flux storage loop 16 is in its high logic level or high flux state, the sense current on output line 50 is in its low logic state and the current passing through input resistor 64 to node 65 is insufficient to ever initiate switching of interferometer 76 or amplifier 75.

Having explained the operation of the schematic circuit of FIG. 5 embodying the mode of operation of the schematic circuit of FIG. 4, it will be understood that the delay 63 has been replaced by a reference current and that the Josephson junction J11 has been replaced by an interferometer 76. The advantage of the FIG. 5 embodiment resides mainly in eliminating the need for the delay line 63 which requires additional area on an integrated circuit chip.

Figure 6:
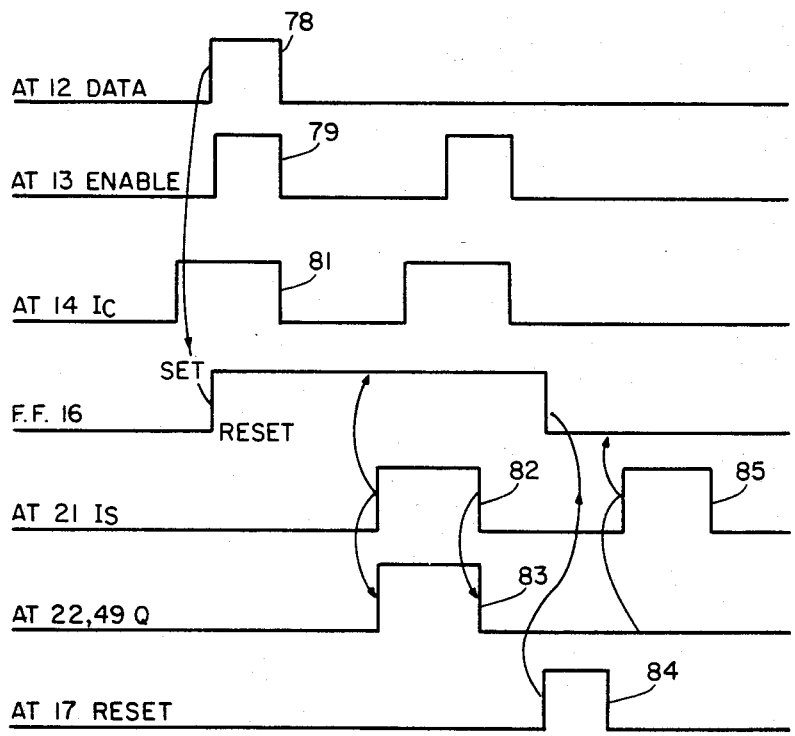
FIG. 6 is a timing diagram employed to illustrate a preferred embodiment mode of operation of the present invention.

Having explained the mode of operation of the schematic circuits shown in FIGS. 2, 4 and 5, it will be appreciated that these circuits can be operated by pulses which are generated in a preferred time sequence to achieve the preferred mode of operation. Refer now to FIGS. 1, 3 and 6 showing a timing diagram for a preferred embodiment mode of operation. Assume that the data pulse 78 on line 12 and the enable pulse 79 on line 13 are present after the flux storage loop 16 has been reset. When a clock pulse 81 is produced on line 14 at the input of AND gate 11 in combination with pulses 78 and 79, there is an output produced on output line 15 which will set the flip-flop 16 into its high flux state. After the flip-flop 16 has been set in its high flux state, a sense current pulse 82 on line 21 will cause an output signal 83 on output lines 22 and 49 during the duration of sense current pulse 82. The high flux state condition of flip-flop 16 is maintained until the next reset pulse 84 is produced on line 17 causing the flip-flop 16 to return to its low flux state or reset condition. If another sense current pulse 85 is produced, the flip-flop 16 is in the low flux or reset condition so that no output pulse is produced at output lines 22 or 49. If flip-flop 16 had not been reset, the high flux state of flip-flop 16 will be sensed.

Having explained a preferred embodiment latch circuit and two modifications of the latch circuit to provide an amplified true and complement output, it will be understood that the present invention logic circuit has been implemented with fewer Josephson junctions than was required in the prior art. Not only are fewer Josephson junctions required to provide an improved circuit, but the input and output components of the circuit are direct-coupled to provide an enhanced speed of operation. Further, it will be noted that the modified embodiments shown in FIGS. 4 and 5 provide a fan-out which is amplified and capable of driving a plurality of loads as has been explained in detail in our previously mentioned co-pending applications Ser. No. 298,148 and Ser. No. 298,149 that teach amplifying OR and amplifying AND gate structures.

While single Josephson junctions J5 and J6 have been shown in the flux storage loop 16 and the sense line 21, interferometers 26 and 76 may be substituted in their place.

We claim:
1. A Josephson junction latch circuit of the type adapted to store one bit of data comprising,
    an AND gate comprising at least four Josephson junctions,
    said AND gate having at least one data input and one enable input,
    said data input and said enable input having two logic states,
    a biasing current source connected to said AND gate,
    said biasing current source having two logic clock states,
    a Josephson flip-flop comprising a flux storage loop,
    said flip-flop having a data input coupled to the output of said AND gate,
    said flip-flop having a reset input coupled to a reset input line,
    said flip-flop having a true quantity output,
    said flip-flop comprising a sense line coupled to said true quantity output and having at least one Josephson junction and a source impedance in said sense line adapted to sense the state of flux in said flux storage loop,
    said flux storage loop being set in a high flux state by the presence of a high logic level data input, a high logic level enable input and a high logic level biasing current source clock,
    a Josephson OR logic circuit connected to the output of said sense line to provide an amplified true quantity output,
    a sink line connected to said Josephone OR logic circuits and to a low voltage reference,
    a second stage Josephson junction amplifier having an input branch and an output branch, said input branch being connected to said sink line, said output branch providing an inverted true quantity output,
    whereby, a high logic input to said OR logic circuit switches said OR logic circuit ON and reduces the current in said sink line causing said second stage amplifier to be switched OFF, and
    whereby, a low level logic input to said OR logic circuit switches said OR logic circuit OFF and increases the current in said sink line causing said second stage amplifier to be switched ON.

2. A Josephson junction latch circuit as set forth in claim 1 wherein said second stage Josephson junction amplifier includes a second Josephson OR logic circuit connected to said Josephson OR logic circuit to provide an inverted amplified output of said true quantity output.

3. A Josephson junction latch circuit as set forth in claim 1 wherein said second stage Josephson junction amplifier includes a second Josephson AND gate connected to said Josephson OR logic circuit to provide an inverted amplified output of said true quantity output.

4. A Josephson junction latch circuit as set forth in claim 1 wherein said storage loop further comprises a reset inductance coupling coil coupled to said reset input line.

5. A Josephson junction logic circuit of the type adapted to store one bit of data and indicate the bit stored comprising, a first stage Josephson junction amplifier having an input branch in parallel with an output branch and coupled to a sink line, said output branch of said first stage amplifier being provided with a true quantity output, an input line connected to said input branch and being adapted to provide two logic levels, a second stage Josephson junction amplifier having an input branch in parallel with an output branch, said input branch of said second stage amplifier being connected to said sink line, said output branch of said second stage amplifier being connected to said sink line, whereby, a high logic level input to said first stage amplifier switches said first stage amplifier ON and reduces the current in said sink line causing said second stage amplifier to be switched OFF, and whereby, a low logic level input to said first stage amplifier switches said first stage amplifier OFF and increases the current in said sink line causing said second stage amplifier to be switched ON.

* * * * *